United States Patent [19]
Punsly et al.

[11] Patent Number: 6,080,836
[45] Date of Patent: Jun. 27, 2000

[54] CYANATE ESTER FILMS THAT PROMOTE PLATING ADHESION TO CYANATE ESTER GRAPHITE COMPOSITES

[75] Inventors: Brian M. Punsly, Torrance; Thomas G. Wong, Cypress, both of Calif.

[73] Assignee: Hughes Electronics Corporation

[21] Appl. No.: 08/822,203

[22] Filed: Mar. 20, 1997

Related U.S. Application Data

[63] Continuation of application No. 08/507,178, Jul. 26, 1995, abandoned.

[51] Int. Cl.$^7$ .................................. B05D 3/00; C08J 7/00
[52] U.S. Cl. .......................... 528/492; 528/489; 427/307; 427/340; 427/341; 427/404; 428/214; 428/336; 428/423.3; 428/425.8
[58] Field of Search ..................................... 528/489, 492; 427/307, 340, 341, 404; 428/214, 336, 423.3, 425.8

[56] References Cited

U.S. PATENT DOCUMENTS

| | | | |
|---|---|---|---|
| 3,642,584 | 2/1972 | Quinn et al. | 427/306 |
| 4,396,679 | 8/1983 | Gaku et al. | 428/423.3 |
| 4,487,816 | 12/1984 | Smith | 428/423.3 |
| 5,286,530 | 2/1994 | Karas et al. | 427/437 |
| 5,300,735 | 4/1994 | Yokono et al. | 428/901 |
| 5,605,781 | 2/1997 | Gelorme et al. | 522/15 |

*Primary Examiner*—Andrew E. C. Merriam
*Attorney, Agent, or Firm*—Michael W. Sales; Georgann S. Grunebach; Terje Gudmestad

[57] ABSTRACT

A method is provided for preparing the surface of a cyanate ester resin composite for metal plating. More particularly, a layer consisting essentially of cyanate ester resin is applied to the surface of the composite. Thereafter, the surface of the resin layer is etched, preferably by treatment with an etching solution containing either a quaternary ammonium hydroxide or a primary amine. Upon completion of the etching process, the cyanate ester resin layer may be successfully plated with metal. The method of the invention operates to improve adhesion between the cyanate ester resin composite and a subsequently-plated metal by providing the composite with a homogenous distribution of mechanical anchoring sites for a subsequently-plated metal, such that uniformity of adhesion is achieved. A cyanate ester resin composite prepared for plating in accordance with the invention may, upon plating, replace certain metallic components in such applications as aircraft, spacecraft, and automobiles given its highly conductive metallic coating.

20 Claims, 4 Drawing Sheets

CYANATE ESTER FILMS THAT PROMOTE PLATING ADHESION TO CYANATE ESTER GRAPHITE COMPOSITES

CROSS-REFERENCE TO RELATED APPLICATIONS

This is a continuation application of Ser. No. 08/507,178, filed Jul. 26, 1995, now abandoned.

The present application is related to application Ser. No. 08/339,380, filed on Nov. 14, 1994, and assigned to the same assignee as the present application, which is directed to a method for preparing the surface of cyanate ester polymer composites for subsequent plating with metal. The method of preparation includes a step of contacting the surface with a preheated solution comprising a quaternary ammonium hydroxide or a primary amine.

BACKGROUND OF THE INVENTION

1. Field of the Invention

The present invention is directed to providing cured cyanate ester composites with a conductive metal surface, and more particularly, to applying a film of cyanate ester resin to the surface of a cyanate ester composite to achieve better adhesion between the composite and a subsequently-plated metal.

2. Description of Related Art

Metals are commonly employed in manufacturing because they offer high degrees of ductility and strength as well as high conductivity. However, metals are generally heavier than other common materials like plastics, such that the positive characteristics attributable to metals often come at the cost of increased product weight. Increased product weight is particularly a concern in industries manufacturing vehicles of transport such as automobiles, aircraft, and spacecraft, as well as payloads of such vehicles, given that increased weight adversely affects fuel economy. Accordingly, these industries have increasingly incorporated non-metallic, lighter-weight materials such as plastics into automobiles and aircraft in an effort to economize fuel.

However, plastics are not universally suitable as substitutes for metals. For example, while plastics offer high degrees of ductility and strength, plastics are relatively nonconductive materials. Thus, plastics cannot supplant metals used as electrical, thermal, or microwave conductors.

It would therefore be desirable to plate a metal coating onto plastic, thereby simultaneously realizing the benefits of both metals and plastics. More specifically, metal plating on plastic materials allows the use of these lighter-weight plastic materials for the bulk of components and minimizes the amount of metal required to achieve a highly conductive surface. Of particular interest is metal plating on cyanate ester polymer composites of cyanate ester resin and graphite, since such composites have certain unique advantages that make them very useful for specific applications, such as applications in communications spacecraft. Specifically, cyanate ester polymer composites can be formulated in ways that make them very resistant to even minute dimensional changes that would otherwise occur as a result of temperature changes or the absorption and desorption of moisture in the presence of air. However, plating metal onto plastic materials, such as cyanate ester polymer composites, has been challenging because these materials do not inherently adhere to one another.

Two methods have been developed by which a cyanate ester composite surface may be treated in preparation for the subsequent plating of metal, both of which are the subjects of previously-filed applications assigned to the present assignee. An application entitled "Preparation of Cured Cyanate Ester Resins and Composites for Metal Plating" (Ser. No. 08/339,390), filed on Nov. 14, 1994 recites treating the surface of cyanate esters polymers and composites with a preheated solution of an alkali metal salt of an alkoxide to achieve greater adhesion between the surface and subsequently-plated metals. A second application filed on even date therewith and entitled "Preparation of Cyanate Ester Polymers and Composites for Metal Plating" (Ser. No. 08/339,380) recites treating the surface with a preheated solution comprising a quaternary ammonium hydroxide or a primary amine.

The above-described surface treatment methods achieve greater adhesion for cyanate ester polymer composites by chemically etching the composite surfaces. Chemical etching textures the composite surfaces, thereby providing mechanical anchoring sites for the plating of metal such that the metal adheres to the composite. Scanning electron micrographs have revealed that surface texturing derives from microcracking in the cyanate ester resin that is wedged between the stiff graphite fibers of the composite.

In practice, however, the adhesion obtained for cyanate ester composites by the above-described surface treatment methods is not uniform across a composite surface. Although the fabrication of such composites involves blending the resin and graphite in an attempt to achieve a substantially uniform distribution of graphite throughout the composite, such composites invariably exhibit wide variations in graphite concentration across their surfaces. Accordingly, some regions of the composite surface are "resin-poor", and these areas may be over-etched by the above-described surface treatment methods. More particularly, etching "resin-poor" regions digests resin needed to glue the graphite fibers in place, such that the graphite fibers actually dissociate from the composite surface. This dissociation of graphite fibers weakens the mechanical anchoring sites necessary for adhesion of a subsequently-plated metal to the composite.

In sum, while the above-described surface treatment methods provide the surface texturing needed for mechanical anchoring sites on composite surfaces, the intrinsic heterogeneity of cyanate ester resin composites on a microscopic scale prohibits uniform surface texturing across the composite surface. Yet, good mechanical adhesion requires a dense and uniform distribution of anchoring sites for plating.

Thus, a need remains to achieve uniformity of surface consolidation of cyanate ester composites to ensure good plating adhesion. The adhesion must be achieved in a simple, easily-implemented manner that lends itself to reproducible results, since a single plating failure in an application such as a satellite microwave circuit can be economically catastrophic.

SUMMARY OF THE INVENTION

In accordance with the invention, a method is provided to prepare the surface of a cyanate ester composite for subsequent metal plating such that the adhesion between the composite and the metal is uniform and strong. The method of the invention comprises first applying a layer consisting essentially of a cyanate ester resin to the surface of the composite then etching the surface to promote adhesion between the textured surface of the cyanate ester composite and a subsequently-plated metal. The cyanate ester resin composite achieved in the practice of the invention exhibits strong, uniform adhesion to metals.

The method of the invention provides a homogenous surface upon which to obtain uniformity of adhesion between the cyanate ester resin composite and a subsequently-plated metal. In the absence of a cyanate ester resin layer, the inconsistent distribution of graphite (or other composite-forming material) across the surface of the cyanate ester resin composite leads to variability in adhesiveness with a subsequently-plated metal. In practice, the invention greatly reduces the chance of "overetching" the composite in "resin-poor" areas of the composite surface.

Accordingly, the method of the invention allows industry to securely equip cyanate ester composites with the requisite highly conductive surface. As such, metallic components may now be confidently replaced with lighter-weight cured cyanate ester resin composites. The resulting metal-plated cyanate ester resin composites offer low moisture absorption, a negligible coefficient of thermal expansion, and strength, while also boasting a metallic, conductive surface.

The method and apparatus of the present invention are expected to have a positive economic impact on the automotive, aircraft, and spacecraft industries. The replacement of metallic compounds with lighter-weight cured cyanate ester resin composites reduces total product weight, which leads to greater fuel efficiency in vehicles of transport. In sum, the method of the present invention offers a practical, effective method to prepare the surface of a cyanate ester resin composite for metal plating and to thereby enable the substitution of such resin composites for heavier metallic components.

DETAILED DESCRIPTION OF THE PREFERRED EMBODIMENTS

Figure 1:
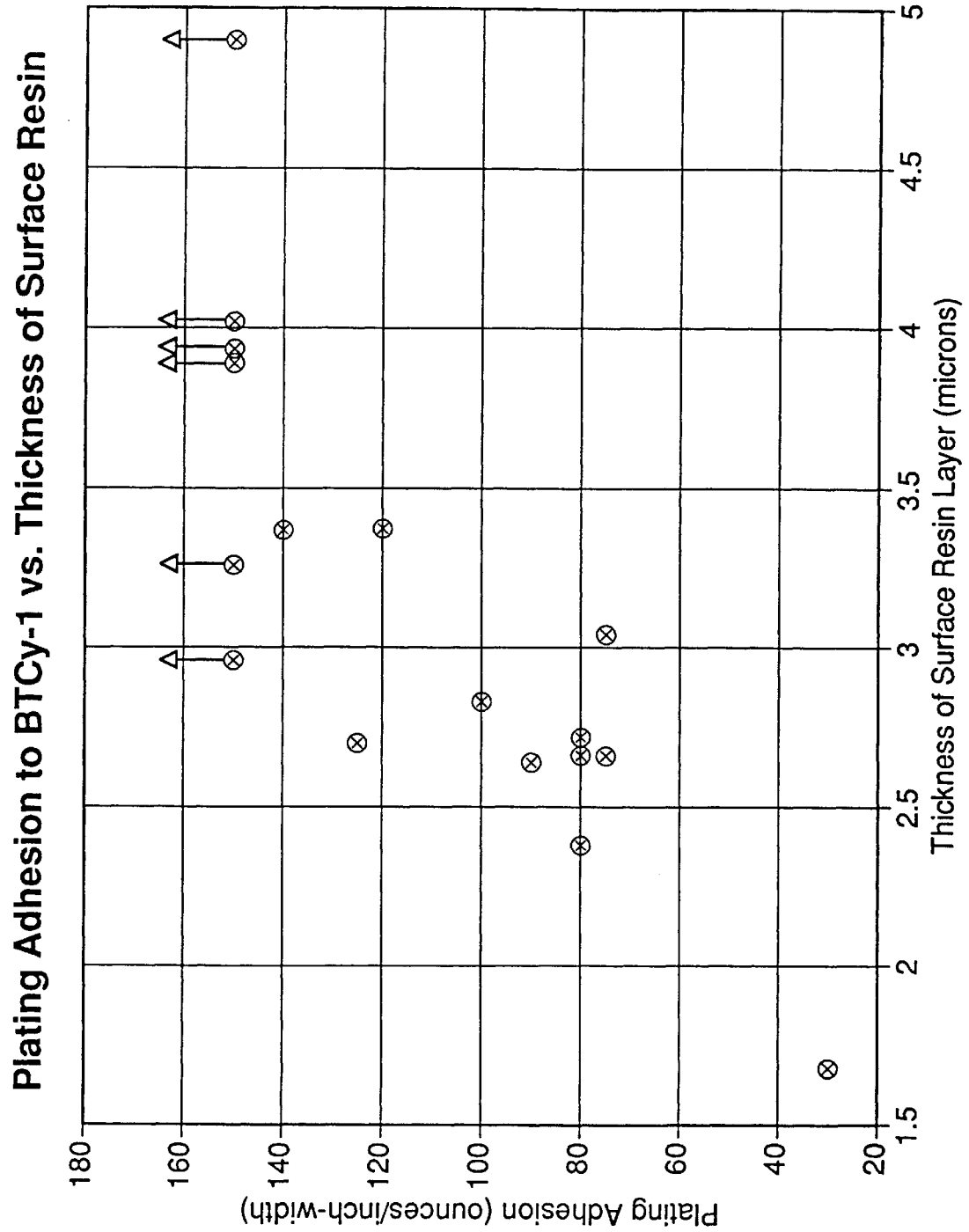
FIGS. 1–4 are plots on rectangular coordinates of plating adhesion (oz/in-width) versus the average total thickness ($\mu$m) of the surface cyanate ester resin for four different cyanate ester resin composites prepared in accordance with the invention, namely, BTCy-1, 954-2A, RS-12, and EX-1515.

The present invention is directed to preparing the surface of a cyanate ester resin composite for plating with metal. More specifically, the method of the present invention involves first applying a layer consisting essentially of a cyanate ester resin to the surface of the composite then etching the surface to promote adhesion between the composite and a subsequently-plated metal.

While the method of the invention may serve to adequately prepare the surface of various resin composites, it is specifically designed to treat the surface of cyanate ester resin composites comprising a cyanate ester resin and a fiber such as graphite or fiberglass. Examples of commercially-available cyanate ester resins that form part of composites benefited in the practice of the invention include, but are not limited to, cyanate ester resin RS12 available from YLA, cyanate ester resins BTCY-1 and EX-1515 available from Bryte, and cyanate ester resin 954-2A available from Fiberite. Examples of commercially-available graphite fibers that form part of cyanate ester resin composites benefited in the practice of the invention include, but are not limited to, XN-80 carbon fibers available from Nippon Granoc, K13B from Mitsubishi, and M55J from Toray. Further, rather than graphite or fiberglass, the composite may comprise Kevlar™ fibers, which are aromatic polyamide fibers that are commercially available from DuPont.

The purity of the components employed in the practice of the invention is that employed in normal commercial practice in the formulation of cyanate ester resin components.

In the practice of the invention, the surface of a cyanate ester resin composite to be plated with a metal is coated with a layer consisting essentially of a cyanate ester resin, thereby providing a homogenous cyanate ester resin layer across the composite surface. More specifically, a layer of uncured cyanate ester resin is placed on the surface of an uncured cyanate ester resin composite in the form of a thin film or casting. Once a layer of uncured cyanate ester is in place, the composite and its resin layer are simultaneously subjected to a curing process, which securely fuses the composite and its resin layer together. Preferably, a cyanate ester resin film having a thickness of about 0.001 inch (about 25 $\mu$m) is applied to the composite surface to achieve a film of resin having a thickness of about 1 to 2 $\mu$m on the surface, since much of the cyanate ester resin from the film diffuses into the laminate during curing.

It is crucial that the cyanate ester resin composite have a sufficient thickness of cyanate ester resin at the surface to provide uniformity of adhesion to the underlying cyanate ester resin composite. In general, the thicker the surface resin, the better the adhesion. FIGS. 1–4 illustrate this basic premise for four different cyanate ester resin composites, as will be discussed in greater detail in the examples. A cursory review of these figures, wherein plating adhesion is plotted against total average thickness of the surface resin, clearly indicates that a thicker surface resin layer typically achieves greater plating adhesion. An insufficient thickness of cyanate ester resin at the surface will provide neither the level of adhesion nor the uniformity of adhesion desired. The precise minimum thickness value varies according to the specific strength of adhesion required in an application as well as the specific composite and resins employed. However, in general, a film of cyanate ester resin should have a sufficient thickness such that when applied to the cyanate ester resin composite surface, the surface has a total cyanate ester resin thickness of at least about 3.5 $\mu$m, which is required to achieve strong, uniform adhesion between a cyanate ester resin composite and a subsequently-plated metal.

The thickness of the cyanate ester resin at the surface is defined herein to be the average depth of resin that may be etched away without the fibers detaching from the surface. The thickness of the surface resin layer, which is herein desired to be least about 3.5 $\mu$m, may be determined experimentally be examining a cross-section of the surface. Particularly, the thickness of the surface layer may be determined by first calculating the total cross sectional area of a particular width of surface layer and then subtracting out the cross sectional area occupied by fibers (determined from micrographs), which results in the cross-sectional amount of resin contained within the surface layer. The average effective thickness of the surface resin layer is then calculated by averaging this procedure across the width x of the surface. It is noted that the fibers in continuous fiber composites may be bounded from below more effectively than ground fibers, such that the cross sectional area occupied by continuous fibers is contemplated to be more substantial in the calculation of the effective thickness of the surface resin layer than that occupied by ground fibers. Typically, a cyanate ester resin film having a thickness of about 1 to 2 $\mu$m bolsters the cyanate ester resin at the surface of the composite to the desired thickness of at least about 3.5 $\mu$m.

Notably, several other methods were examined to achieve a relatively thick surface layer of cyanate ester resin, but only the direct application of a cyanate ester resin layer on the surface of a cyanate ester resin composite provided a sufficiently homogenous surface for uniformity of adhesion. Some of the non-working methods include (1) staging the uncured cyanate ester resin at room temperature before curing; (2) staging the uncured cyanate ester resin at a temperature ranging from about 120° F. to 180° F, in an autoclave before curing; (3) rapid ramping to the cure temperature in the autoclave (about 10° F./min); (4) staging combined with rapid ramping to the cure temperature in the autoclave; (5) curing the parts (microwave filter housings) by resistance heating of the mold to either augment or replace the radiation heating of the autoclave; (6) employing a cyanate ester resin composite having a very large resin content by mass (i.e., 38%); and (7) combining high resin contents with the curing modifications of methods (1) through (5) above. None of these methods satisfactorily provided a resin-rich, essentially homogenous layer atop the composite.

The manner in which a cure of the layered cyanate ester composite is achieved forms no part of this invention, with a typical curing process being conducted in an autoclave at a temperature ranging from about 250° to 350° F. The length of time required to achieve a cure depends entirely upon the specific cyanate ester being cured, while the length of time required to ramp to the cure temperature depends upon the thermal mass and emissivity of the part.

The cyanate ester resin employed as a layer in the practice of the invention is not limited to any particular group of cyanate ester resins. Therefore, examples of cyanate ester resins that may be suitably employed as a surface layer include, but are not limited to, the following commercially-available cyanate ester resins: RS12 available from YLA, cyanate ester resins BTCY-1 and EX-1515 available from Bryte, and cyanate ester resin 954-2A available from Fiberite. Moreover, the cyanate ester resin of the layer need not be the resin contained in the underlying cyanate ester resin composite. For example, a cyanate ester resin composite comprising EX-1515 and graphite fibers is benefited in the practice of the invention by the application of a cyanate ester resin layer consisting essentially of a modified version of EX-1515 resin that does not contain the "tougheners" used in Bryte's custom formula for EX-1515. Notably, the cyanate ester resin composite EX-1515 is normally considered to be an unsuitable candidate for chemical etchings and metal plating. However, by coating EX-1515 with a carefully chosen resin layer in the practice of the invention, EX-1515 may be successfully etched and plated, as is shown in the examples below with regard to EX-1515. Thus, the method of the present invention expands the field of cyanate ester resin composites considered to be viable metal-plating candidates.

Once the layer of cyanate ester resin is secured to the cyanate ester resin composite, the surface of the resin layer may then be etched in preparation for a subsequent metal plating. The surface may be etched in accordance with the method disclosed in the application entitled "Preparation of Cyanate Ester Polymers and Composites for Metal Plating" (Ser. No. 08/339,380), which recites treating the surface of cyanate ester polymer composites with a preheated solution comprising a quaternary ammonium hydroxide or a primary amine. In general, the method disclosed in this related application, discussed below in greater detail, involves immersing the surface of the cured cyanate ester resin composite to be metal-plated into the solution, which may or may not be preheated, and rinsing the surface with water and/or alcohol upon removal from the solution.

Accordingly, the first step in pretreating the cyanate ester resin composite involves immersing the cyanate ester resin composite surface in an etching solution comprising a quaternary ammonium hydroxide or a primary amine. In the event that a quaternary ammonium hydroxide is chosen to etch the composite, the surface of the cured resin composite is placed in contact with a solution comprising a quaternary ammonium hydroxide ($R_4$—NOH) where R may be represented by an alkyl group, aryl-alkyl group, a hydroxy-alkyl group, or an alkoxy-alkyl group. More specifically, the quaternary ammonium hydroxide may be represented by such compounds as tetrabutylammonium hydroxide, benzyltrimethyl-ammonium hydroxide, tetramethylammonium hydroxide, tetraethylammonium hydroxide, tetrapropylammonium hydroxide, tetrapentylammonium hydroxide, tetrahexylammonium hydroxide, and (2-hydroxyethyl) trimethyl ammonium hydroxide, which is also known as choline. Preferably, the alkyl groups employed have chain lengths ranging from one to six carbon atoms. Each of these quaternary ammonium hydroxide compounds is commercially available. A quaternary ammonium hydroxide solution is effective at a concentration ranging from as little as 4 wt % but may be employed without dilution.

In the event that a primary amine is used to etch the cyanate ester resin composite layer, the surface of the cured resin is placed in contact with an etching solution comprising a primary amine (R—$NH_2$) where R may be represented by an alkyl group, an aryl-alkyl group, a hydroxy-alkyl group, or an alkoxy-alkyl group. More specifically, suitably-employed primary amines must have a boiling point ("BP") significantly higher than the operating temperature of the solution, which is maintained at a temperature between room temperature and 125° C. and preferably maintained at a temperature between 45° C. and 65° C. Examples of suitable primary amines include triethylenetetraamine (BP≅266° C.), hexanediamine (BP≅204° C.), octylamine (BP≅175° C.), and ethylenediamine (BP≅118° C.). Other primary amines believed suitable include diethylenetriamine, tetraethylenepentaamine, 1,7-diaminoheptane, 2-methyl-1,5-pentanediamine, 1,5-pentanediamine, 1,3-propanediamine, 1,2-propanediamine, 1,4-butanediamine, pentylamine, hexyl-amine, heptylamine, octylamine, nonylamine, and decylamine. Each of these primary amines is commercially available. Secondary and tertiary amines are not suitable because they either react extremely slowly or not at all. Notably, triethylenetetraamine has both primary and secondary amine groups, but the secondary amine groups are not believed to contribute significantly to texturizing the cyanate ester resin composite surface.

A two-step etching process may be employed using solutions comprising primary amines. More particularly, the cyanate ester resin composite is first immersed in a relatively aggressive primary amine and then immersed in a relatively less aggressive primary amine. Examples of relatively aggressive primary amines are those primary amines within the class of short-chain primary diamines.

Regardless of whether the etching solution comprises a quaternary ammonium hydroxide or a primary amine, the solution may also optionally comprise an additional solvent, such as ethoxyethanol, propanediol, and pyrrolidone, among others. Such solvents serve various purposes, including to dissolve decomposition products; to dilute the etching solution; to swell the undecomposed portion of the resin; and to smooth the surface of the resin.

The temperature of the etching solution is maintained at a temperature within the range of about room temperature to 125° C., and preferably about 45° to 65° C., with the most preferable temperature depending upon the particular cured cyanate ester resin composite being treated. If the temperature is too low, the adhesion achieved may be less than optimal. On the other hand, if the temperature is too high, the chemical reaction rate is greatly accelerated so that the process may be uncontrollable. In reality, the upper temperature limit is often determined by the refluxing temperature of the solution. It is preferable that the process temperature be well below the boiling point of the solution.

To perform the chemically etching treatment, the cyanate ester resin composite surface, as layered with a cyanate ester resin, is immersed in the etching solution for at least 10 seconds. Preferably, the composite remains immersed for a period of time ranging from 10 seconds to 20 minutes. An immersion of less than 10 seconds does not adequately prepare the surface for metal plating, while an immersion lasting more than 20 minutes dissolves an excessive amount of resin, resulting in loss of adhesion.

At the conclusion of the immersion step, the cyanate ester resin composite surface is removed from the etching solution, rinsed, and dried. The composite surface may be rinsed with water (preferably deionized), an organic solvent, or a combination thereof, with the purpose of rinsing being to smooth the surface and to partially redissolve decomposition products. Solvents that may be employed as rinsing agents include, but are not limited to, those common organic solvents listed above for use in the solution. The composite surface may be rinsed with room-temperature water and/or organic solvent from a beaker for 5 minutes or more, but typically 30 seconds of rinsing is sufficient. The etched composite surface is then dried, which is preferably accomplished either by allowing the resin surface to air-dry at room temperature or by blowing the surface dry with a stream of nitrogen. Once dry, the cyanate ester resin composite surface is fully prepared for metal plating and may be plated at any time for up to one week.

The method used to perform the metal plating to the cyanate ester resin composite, having been coated with a cyanate ester resin layer and chemically etched, does not form part of the invention and may be accomplished by any of the conventional processes known in the art, such as electroplating, electroless chemistry, and sputtering. One traditional method entails four basic sequential steps and utilizes both electroless chemistry and electroplating. First, the composite surface is treated with an acidic solution of palladium chloride and stannous chloride. This acidic solution is available commercially; for example, it is sold under the trade name Cataposit 44 by Shipley. Second, the composite surface is treated with a hydrochloric acid accelerator, such as commercially-available Accelerator No. 19 from Shipley. Third, the composite surface is treated with either a nickel or copper electroless plating solution. An electroless nickel plating solution is prepared by combining 150 ml of Solution A with 100 ml of Solution B, both of which are commercially available from Allied Kelite, and then diluting the 250 ml of solution to 1 L with water. Alternatively, an electroless copper solution can be prepared by mixing Enplate Cu-700A (6% by volume), Enplate Cu-700B (6% by volume), Enplate Cu-700C (2.25% by volume), and water. Fourth, and finally, the composite surface is electroplated with a metal aside from nickel or copper, such as silver. Optionally, the metal plated composite surface may then be baked to further harden the metal coating. At the conclusion of the metal plating process, a metal coating will have been applied to the cyanate ester resin composite surface, thereby providing the composite with a highly conductive surface.

The method of the invention provides for more uniform adhesion between cured cyanate ester resin composites and metal deposited by plating, thereby enabling the formation of a highly conductive surface on cured cyanate ester resin composites. The adhesion attained in the practice of the invention is generally very good according to ASTM method D3359B performance standards, as discussed in detail in the examples below.

EXAMPLES

To demonstrate the benefits achieved in the practice of the invention, four series of cyanate ester resin composites comprising a cyanate ester resin and graphite fibers were formulated, with the graphite fibers representing about 50 to 55 vol % of the composite. The cyanate ester resins employed in the composites were BTCy-1 from Bryte, 954-2A from Fiberite, RS-12 from YLA, and EX-1515 from Bryte. For each composite series, graphite composite unidirectional tapes were stacked on top of each other at various angles to each other to provide a conventional composite formation. Each composite formation was provided with a cyanate ester resin layer having a thickness of about 0.001 inch, with the cyanate ester resin being the same as that in the underlying composite. Specifically, the cyanate ester resin layer was applied by casting of films of the resin that were laid on top of the stack of unidirectional tapes. The resulting formation was wrapped on a mandrel with the ply of pure cyanate ester resin facing the surface to be plated. Each assembly was then cured in an autoclave using conventional cure cycles as specified by the vendor of the particular unidirectional tape. The assembly was then etched using a two-step process wherein the composite surface was first immersed in a relatively aggressive primary amine followed by immersion in a relatively nonaggressive primary amine. In this manner, the assemblies of unidirectional tapes were cured into panels, cut into plating coupons measuring about 1 inch×2 inches, and then etched.

The etched plating coupons were plated with a first layer of copper followed by a second layer of silver in accordance with the process described above. More particularly, the composite coupon surfaces were first cleaned with acidic solutions then plated with copper by immersion in an electroless plating solution and finally electroplated with silver.

Thereafter, the adhesion between the plating coupons and the metal plating was determined in accordance with ASTM method D3359 "Test Method B—Cross-Cut Tape Test" (hereinafter "ASTM method D3359B") which is specifically used to assess the adhesion of coating films to metallic substrates by applying and removing pressure-sensitive tape over cuts made in the film. In substantial accordance with this standard test, the films were first cut in a cross-hatch fashion using an Exacto knife, with six ¾-inch long cuts in one direction spaced 1.5 mm apart and with another six similarly-spaced ¾-inch cuts perpendicular over the first six. A pressure-sensitive tape was placed over the crosshatching, with the applied tape being rubbed with a pencil eraser to set it. After waiting from one to two minutes, the tape was removed by seizing the free end and pulling the tape back upon itself at approximately a 180° angle.

To quantify the adhesion of the plating coupons, a range of pressure-sensitive tapes were employed that had been calibrated to various levels of plating adhesion. More particularly, pressure-sensitive tapes were calibrated to 30-, 40-, 70-, 90-, 135-, and 150-oz./inch-width plating adhesions. Each plating coupon was first tested with a tape having a relatively low adhesion rating and then was tested with tapes having incrementally higher levels of adhesion until the removal of metal was observed. The plating adhesion of that particular tape was then recorded for the particular plating coupon.

Figure 2:
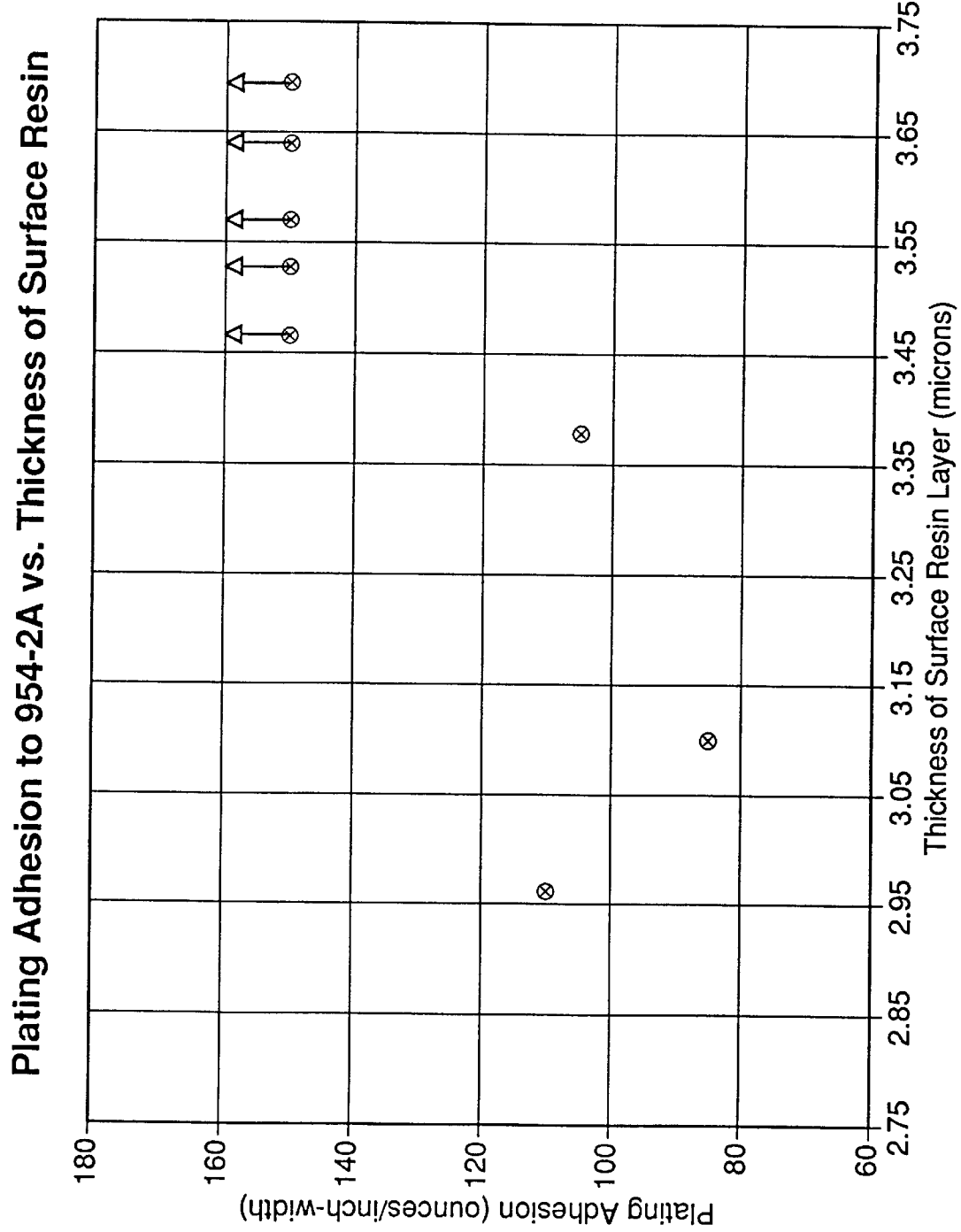
Figure 3:
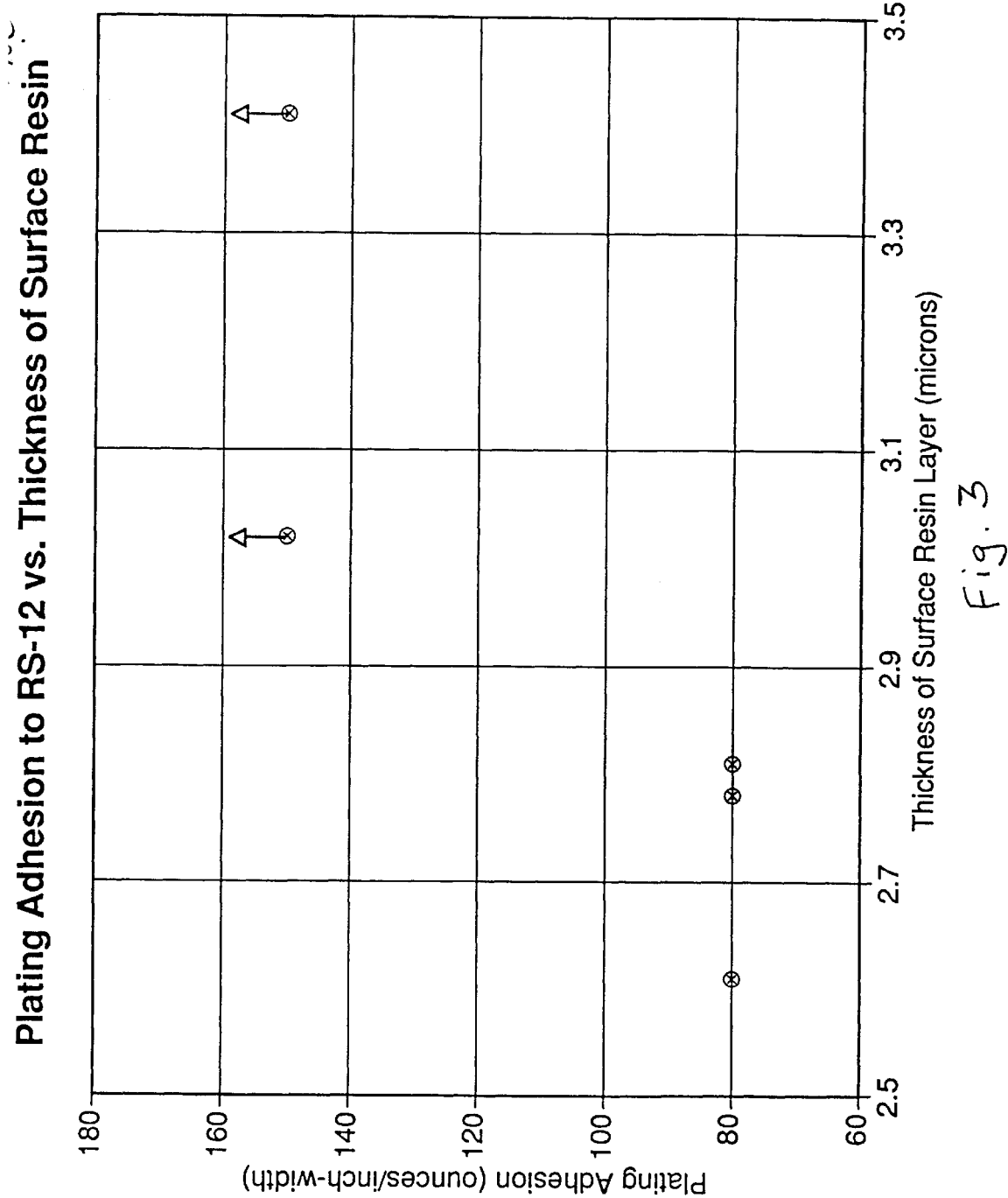

FIGS. 1–4 are each plots of plating adhesion (ounces/inch-width) versus the total thickness of the surface cyanate ester resin on rectangular coordinates for the BTCY-1, 954-2A, RS-12, and EX-1515 plating coupons, respectively. Typically, each point in FIGS. 1–4 represents 50–150 coupons which were plated and tested for adhesion. The value of the adhesion in the figures is the average of the sample coupons from each batch. In general, each resin series as depicted in FIGS. 1–3 indicates that a total surface cyanate ester resin thickness of at least about 3.5 µm is necessary to consistently achieve an optimum plating adhesion of at least about 150 ounces/inch-width, although the RS-12 composite of FIG. 3 might only require a surface resin layer of about 3.0 µm. Since the thickness of the cyanate ester resin in the plating coupons averaged about 2.0 to 2.5 µm when cured without any added layer of resin, it is demonstrated that a cyanate ester layer of only about 1 µm was enough to significantly and reliably bolster adhesion.

Figure 4:
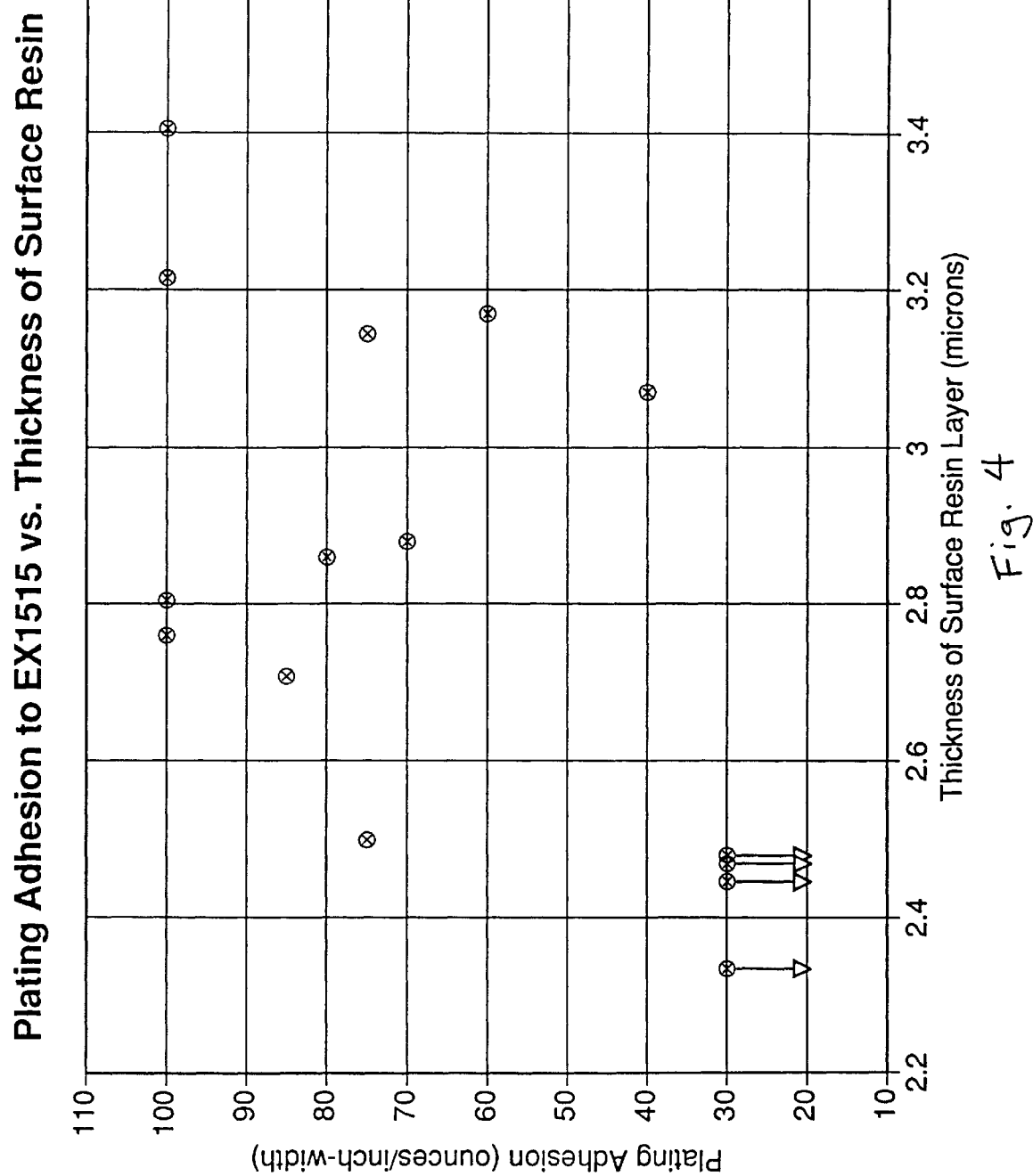

Referring to FIG. 4, the EX-1515 coupons did not plate reliably from batch to batch regardless of the total thickness of the surface cyanate ester resin. Thus, applying a film of EX-1515 to the EX-1515 composite did not markedly improve its adhesion to metal.

To illustrate that the particular cyanate ester resin used in the layer does not have to be the same as the resin in the underlying composite, an EX-1515 composite assembly was formulated having a modified EX-1515 film (available from Bryte) that did not contain the proprietary "tougheners" used in Bryte's custom formulation of EX-1515. Tables 1 and 2 below represent two separate batches of EX-1515 plating coupons prepared in this manner for adhesion testing.

Table 1 represents a single batch of 40 coupons that were fabricated from a particular batch of unidirectional tape and modified EX-1515 film in the manner described above, while Table 2 represents a distinct single batch of 32 coupons that were similarly fabricated. The coupons were cured in conventional curing processes specified by the vendor of the tapes and were then etched in a two-step process. A primary etch was conducted on the cured coupons using an etching solution comprising an aggressive amine followed by a secondary etch using an etching solution of a weaker amine. Columns C and G of Tables 1 and 2 indicate the immersion time and the temperature of the etching solution used in the primary and secondary etchings, respectively. The etched coupons were then electroplated with copper and silver to the thicknesses indicated in Column I of Tables 1 and 2.

The adhesion of the samples was tested according to ASTM method D3359. However, only a 150-oz. tape was used to test for adhesiveness rather than the 40-oz. tape specified by ASTM method D3359, in anticipation of superior plating adhesion. Upon removal of the tape per ASTM method D3359, the cross-hatched film was then visually compared to illustrations for grading the adhesion on a scale of 0 to 5. Each of the 72 samples in the two batches exhibited an adhesion rating of "5" using the modified ASTM tape test method, which translates to the strongest adhesion.

In comparison, an EX-1515 composite having even a thick unmodified EX-1515 resin layer performed inconsistently (see FIG. 4). Accordingly, it has been demonstrated that the use of a cyanate ester resin other than that in the underlying cyanate ester resin composite can result in reliably superior adhesion.

TABLE 1

Surface Films on EX-1515

| | A | B | C | F | G | H | I | K | L | M | N | O | P | Q |
|---|---|---|---|---|---|---|---|---|---|---|---|---|---|---|
| 1 | | | | | Plating of EX-1515 with a modified surface film (first batch) | | | | | | | | | |
| 2 | | | | | Origination Date 3/10/95 | | | | | | | | | |
| 3 | | | Primary | | Secondary | | | | ASTM D3359 Tape Test | | | | | |
| 6 | | | Etch | Ag Plated | Etch | | Ag Plated | | Tape Test, Ag Plated & baked overnight, 90° C. | | | | | |
| 7 | S/N | MTRL | Time/° C. | Size | Time/° C. | Notes | Finish | 20 Oz | 45 Oz | 70 Oz | 80 Oz | 90 Oz | 135 Oz | 150 Oz |
| 9 | 1 | 54-14 | 2.4/65 | 1" × 2" | 1.2/45 | | 100/300 µIn Cu/Ag | Not tested | | | | | | 5 |
| 10 | 2 | 54-14 | 2.4/65 | 1" × 2" | 1.2/45 | | 100/300 µIn Cu/Ag | Not tested | | | | | | 5 |
| 11 | 3 | 54-14 | 2.4/65 | 1" × 2" | 1.2/45 | | 100/300 µIn Cu/Ag | Not tested | | | | | | 5 |
| 12 | 4 | 54-14 | 2.4/65 | 1" × 2" | 1.2/45 | | 100/300 µIn Cu/Ag | Not tested | | | | | | 5 |
| 13 | 5 | 54-14 | 2.4/65 | 1" × 2" | 1.2/45 | | 100/300 µIn Cu/Ag | Not tested | | | | | | 5 |
| 14 | 6 | 54-14 | 2.4/65 | 1" × 2" | 1.2/45 | | 100/300 µIn Cu/Ag | Not tested | | | | | | 5 |
| 15 | 7 | 54-14 | 2.4/65 | 1" × 2" | 1.2/45 | | 100/300 µIn Cu/Ag | Not tested | | | | | | 5 |
| 16 | 8 | 54-14 | 2.4/65 | 1" × 2" | 1.2/45 | | 100/300 µIn Cu/Ag | Not tested | | | | | | 5 |
| 17 | 9 | 54-14 | 2.4/65 | 1" × 2" | 1.2/45 | | 100/300 µIn Cu/Ag | Not tested | | | | | | 5 |
| 18 | 10 | 54-14 | 2.4/65 | 1" × 2" | 1.2/45 | | 100/300 µIn Cu/Ag | Not tested | | | | | | 5 |
| 19 | 11 | 54-14 | 2.4/65 | 1" × 2" | 1.2/45 | | 100/300 µIn Cu/Ag | Not tested | | | | | | 5 |
| 20 | 12 | 54-14 | 2.4/65 | 1" × 2" | 1.2/45 | | 100/300 µIn Cu/Ag | Not tested | | | | | | 5 |

TABLE 1-continued

Surface Films on EX-1515

| | A | B | C | F | G | H | I | K | L | M | N | O | P | Q |
|---|---|---|---|---|---|---|---|---|---|---|---|---|---|---|
| 1 | | | | | Plating of EX-1515 with a modified surface film (first batch) | | | | | | | | | |
| 2 | | | | | | | Origination Date 3/10/95 | | | | | | | |
| 3 | | | Primary | | Secondary | | | | | ASTM D3359 Tape Test | | | | |
| 6 | | | Etch | Ag Plated | Etch | | Ag Plated | | | Tape Test, Ag Plated & baked overnight, 90° C. | | | | |
| 7 | S/N | MTRL | Time/° C. | Size | Time/° C. | Notes | Finish | 20 Oz | 45 Oz | 70 Oz | 80 Oz | 90 Oz | 135 Oz | 150 Oz |
| 21 | 13 | 54-14 | 2.4/65 | 1" × 2" | 1.2/45 | | 100/300 μIn Cu/Ag | Not tested | | | | | | 5 |
| 22 | 14 | 54-14 | 2.4/65 | 1" × 2" | 1.2/45 | | 100/300 μIn Cu/Ag | Not tested | | | | | | 5 |
| 23 | 15 | 54-14 | 2.4/65 | 1" × 2" | 1.2/45 | | 100/300 μIn Cu/Ag | Not tested | | | | | | 5 |
| 24 | 16 | 54-14 | 2.4/65 | 1" × 2" | 1.2/45 | | 100/300 μIn Cu/Ag | Not tested | | | | | | 5 |
| 25 | 17 | 54-14 | 2.4/65 | 1" × 2" | 1.2/45 | | 100/300 μIn Cu/Ag | Not tested | | | | | | 5 |
| 26 | 18 | 54-14 | 2.4/65 | 1" × 2" | 1.2/45 | | 100/300 μIn Cu/Ag | Not tested | | | | | | 5 |
| 27 | 19 | 54-14 | 2.4/65 | 1" × 2" | 1.2/45 | | 100/300 μIn Cu/Ag | Not tested | | | | | | 5 |
| 28 | 20 | 54-14 | 2.4/65 | 1" × 2" | 1.2/45 | | 100/300 μIn Cu/Ag | Not tested | | | | | | 5 |
| 29 | 21 | 54-14 | 2.4/65 | 1" × 2" | 1.2/45 | | 100/300 μIn Cu/Ag | Not tested | | | | | | 5 |
| 30 | 22 | 54-14 | 2.4/65 | 1" × 2" | 1.2/45 | | 100/300 μIn Cu/Ag | Not tested | | | | | | 5 |
| 31 | 23 | 54-14 | 2.4/65 | 1" × 2" | 1.2/45 | | 100/300 μIn Cu/Ag | Not tested | | | | | | 5 |
| 32 | 24 | 54-14 | 2.4/65 | 1" × 2" | 1.2/45 | | 100/300 μIn Cu/Ag | Not tested | | | | | | 5 |
| 33 | 25 | 54-14 | 2.4/65 | 1" × 2" | 1.2/45 | | 100/300 μIn Cu/Ag | Not tested | | | | | | 5 |
| 34 | 26 | 54-14 | 2.4/65 | 1" × 2" | 1.2/45 | | 100/300 μIn Cu/Ag | Not tested | | | | | | 5 |
| 35 | 27 | 54-14 | 2.4/65 | 1" × 2" | 1.2/45 | | 100/300 μIn Cu/Ag | Not tested | | | | | | 5 |
| 36 | 28 | 54-14 | 2.4/65 | 1" × 2" | 1.2/45 | | 100/300 μIn Cu/Ag | Not tested | | | | | | 5 |
| 37 | 29 | 54-14 | 2.4/65 | 1" × 2" | 1.2/45 | | 100/300 μIn Cu/Ag | Not tested | | | | | | 5 |
| 38 | 30 | 54-14 | 2.4/65 | 1" × 2" | 1.2/45 | | 100/300 μIn Cu/Ag | Not tested | | | | | | 5 |
| 39 | 31 | 54-14 | 2.4/65 | 1" × 2" | 1.2/45 | | 100/300 μIn Cu/Ag | Not tested | | | | | | 5 |
| 40 | 32 | 54-14 | 2.4/65 | 1" × 2" | 1.2/45 | | 100/300 μIn Cu/Ag | Not tested | | | | | | 5 |
| 41 | 33 | 54-14 | 2.4/65 | 1" × 2" | 1.2/45 | | 100/300 μIn Cu/Ag | Not tested | | | | | | 5 |
| 42 | 34 | 54-14 | 2.4/65 | 1" × 2" | 1.2/45 | | 100/300 μIn Cu/Ag | Not tested | | | | | | 5 |
| 43 | 35 | 54-14 | 2.4/65 | 1" × 2" | 1.2/45 | | 100/300 μIn Cu/Ag | Not tested | | | | | | 5 |
| 44 | 36 | 54-14 | 2.4/65 | 1" × 2" | 1.2/45 | | 100/300 μIn Cu/Ag | Not tested | | | | | | 5 |
| 45 | 37 | 54-14 | 2.4/65 | 1" × 2" | 1.2/45 | | 100/300 μIn Cu/Ag | Not tested | | | | | | 5 |
| 46 | 38 | 54-14 | 2.4/65 | 1" × 2" | 1.2/45 | | 100/300 μIn Cu/Ag | Not tested | | | | | | 5 |
| 47 | 39 | 54-14 | 2.4/65 | 1" × 2" | 1.2/45 | | 100/300 μIn Cu/Ag | Not tested | | | | | | 5 |
| 48 | 40 | 54-14 | 2.4/65 | 1" × 2" | 1.2/45 | | 100/300 μIn Cu/Ag | Not tested | | | | | | 5 |

TABLE 2

Surface Films on EX-1515

|  | A | B | C | F | G H | I | K | L | M | N | O | P | Q |
|---|---|---|---|---|---|---|---|---|---|---|---|---|---|
| 1 | | | | | Plating of EX-1515 with a modified surface film (first batch) | | | | | | | | |
| 2 | | | | | Origination Date 3/10/95 | | | | | | | | |
| 3 | | | Primary | | Secondary | | | ASTM D3359 Tape Test | | | | | |
| 6 | | | Etch | Ag Plated | Etch | Ag Plated | | Tape Test, Ag Plated & baked overnight, 90° C. | | | | | |
| 7 | S/N | MTRL | Time/° C. | Size | Time/° C. Notes | Finish | 20 Oz | 45 Oz | 70 Oz | 80 Oz | 90 Oz | 135 Oz | 150 Oz |
| 17 | 1 | 54-15 | 2.0/65 | 1" × 2" | 1.0/45 | 100/300 μIn Cu/Ag | Not tested | | | | | | 5 |
| 18 | 2 | 54-15 | 2.0/65 | 1" × 2" | 1.0/45 | 100/300 μIn Cu/Ag | Not tested | | | | | | 5 |
| 19 | 3 | 54-15 | 2.0/65 | 1" × 2" | 1.0/45 | 100/300 μIn Cu/Ag | Not tested | | | | | | 5 |
| 20 | 4 | 54-15 | 2.0/65 | 1" × 2" | 1.0/45 | 100/300 μIn Cu/Ag | Not tested | | | | | | 5 |
| 21 | 5 | 54-15 | 2.0/65 | 1" × 2" | 1.0/45 | 100/300 μIn Cu/Ag | Not tested | | | | | | 5 |
| 22 | 6 | 54-15 | 2.0/65 | 1" × 2" | 1.0/45 | 100/300 μIn Cu/Ag | Not tested | | | | | | 5 |
| 23 | 7 | 54-15 | 2.0/65 | 1" × 2" | 1.0/45 | 100/300 μIn Cu/Ag | Not tested | | | | | | 5 |
| 24 | 8 | 54-15 | 2.0/65 | 1" × 2" | 1.0/45 | 100/300 μIn Cu/Ag | Not tested | | | | | | 5 |
| 25 | 9 | 54-15 | 2.5/65 | 1" × 2" | 1.25/45 | 100/300 μIn Cu/Ag | Not tested | | | | | | 5 |
| 26 | 10 | 54-15 | 2.5/65 | 1" × 2" | 1.25/45 | 100/300 μIn Cu/Ag | Not tested | | | | | | 5 |
| 27 | 11 | 54-15 | 2.5/65 | 1" × 2" | 1.25/45 | 100/300 μIn Cu/Ag | Not tested | | | | | | 5 |
| 28 | 12 | 54-15 | 2.5/65 | 1" × 2" | 1.25/45 | 100/300 μIn Cu/Ag | Not tested | | | | | | 5 |
| 29 | 13 | 54-15 | 2.5/65 | 1" × 2" | 1.25/45 | 100/300 μIn Cu/Ag | Not tested | | | | | | 5 |
| 30 | 14 | 54-15 | 2.5/65 | 1" × 2" | 1.25/45 | 100/300 μIn Cu/Ag | Not tested | | | | | | 5 |
| 31 | 15 | 54-15 | 2.5/65 | 1" × 2" | 1.25/45 | 100/300 μIn Cu/Ag | Not tested | | | | | | 5 |
| 32 | 16 | 54-15 | 2.5/65 | 1" × 2" | 1.25/45 | 100/300 μIn Cu/Ag | Not tested | | | | | | 5 |
| 33 | 17 | 54-15 | 3.0/65 | 1" × 2" | 1.5/45 | 1000/300 μIn Cu/Ag | Not tested | | | | | | 5 |
| 34 | 18 | 54-15 | 3.0/65 | 1" × 2" | 1.5/45 | 100/300 μIn Cu/Ag | Not tested | | | | | | 5 |
| 35 | 19 | 54-15 | 3.0/65 | 1" × 2" | 1.5/45 | 100/300 μIn Cu/Ag | Not tested | | | | | | 5 |
| 36 | 20 | 54-15 | 3.0/65 | 1" × 2" | 1.5/45 | 100/300 μIn Cu/Ag | Not tested | | | | | | 5 |
| 37 | 21 | 54-15 | 3.0/65 | 1" × 2" | 1.5/45 | 100/300 μIn Cu/Ag | Not tested | | | | | | 5 |
| 38 | 22 | 54-15 | 3.0/65 | 1" × 2" | 1.5/45 | 100/300 μIn Cu/Ag | Not tested | | | | | | 5 |
| 39 | 23 | 54-15 | 3.0/65 | 1" × 2" | 1.5/45 | 100/300 μIn Cu/Ag | Not tested | | | | | | 5 |
| 40 | 24 | 54-15 | 3.0/65 | 1" × 2" | 1.5/45 | 100/300 μIn Cu/Ag | Not tested | | | | | | 5 |
| 41 | 25 | 54-15 | 3.5/65 | 1" × 2" | 1.0/45 | 100/300 μIn Cu/Ag | Not tested | | | | | | 5 |
| 42 | 26 | 54-15 | 3.5/65 | 1" × 2" | 1.0/45 | 100/300 μIn Cu/Ag | Not tested | | | | | | 5 |
| 43 | 27 | 54-15 | 3.5/65 | 1" × 2" | 1.0/45 | 100/300 μIn Cu/Ag | Not tested | | | | | | 5 |
| 44 | 28 | 54-15 | 3.5/65 | 1" × 2" | 1.0/45 | 100/300 μIn Cu/Ag | Not tested | | | | | | 5 |
| 45 | 29 | 54-15 | 3.5/65 | 1" × 2" | 1.0/45 | 100/300 μIn Cu/Ag | Not tested | | | | | | 5 |
| 46 | 30 | 54-15 | 3.5/65 | 1" × 2" | 1.0/45 | 100/300 μIn Cu/Ag | Not tested | | | | | | 5 |
| 47 | 31 | 54-15 | 3.5/65 | 1" × 2" | 1.0/45 | 100/300 μIn Cu/Ag | Not tested | | | | | | 5 |
| 48 | 32 | 54-15 | 3.5/65 | 1" × 2" | 1.0/45 | 100/300 μIn Cu/Ag | Not tested | | | | | | 5 |

Thus, there has been disclosed a method for improving the adherence of plated metal to cured cyanate ester resin composite surfaces. It will be readily apparent to those of ordinary skill in this art that various changes and modifications of an obvious nature may be made without departing from the spirit of the invention, and all such changes and modifications are considered to fall within the scope of the invention, as defined by the appended claims.

What is claimed is:

1. A method for preparing the surface of a cyanate ester resin composite for a subsequent plating with metal, comprising:

(a) providing a cyanate ester resin composite, said cyanate ester resin composite having a surface and comprising a cyanate ester resin and fiber;

(b) applying a layer consisting essentially of a cyanate ester resin to said surface of said cyanate ester resin composite, thereby producing a layered composite surface; and (c) etching said layered composite surface to promote adhesion directly between said cyanate ester resin composite and said subsequently-plated metal by treating said layer with an etching solution comprising a compound selected from the group consisting of a quaternary ammonium hydroxide and a primary amine to provide a homogeneous layered composite surface.

2. The method of claim 1 wherein said cyanate ester resin composite comprises a cyanate ester resin and fiber selected from the group consisting of graphite, fiberglass, and aromatic polyamide.

3. The method of claim 1 wherein said layer is applied to said surface of said cyanate ester resin composite by first placing said layer on said surface then simultaneously curing said layer and said cyanate ester resin composite, thereby securing said layer to said surface.

4. The method of claim 3 wherein said surface of said cyanate ester resin composite comprises surface cyanate ester resin, said surface cyanate ester resin and said layer together having a thickness of at least about 3.5 µm once cured.

5. The method of claim 4 wherein said layer of step (b) of claim 1 is applied to a thickness of at least about 0.001 inch (25 µm).

6. The method of claim 5 wherein said layer, following etching of step (c) of claim 1, has a thickness ranging from about 1 to 2 µm.

7. The method of claim 1 wherein said layer is treated sequentially with at least two etching solutions comprising a primary amine.

8. The method of claim 1 wherein said adhesion between said etched cyanate ester resin composite and said subsequently-plated metal ranges from about 4 to 5 as measured by ASTM method D3359B using a 150-oz/inch-width tape.

9. The method of claim 1 wherein said subsequently-plated metal is selected from the group consisting of nickel and copper.

10. A cyanate ester resin composite prepared for subsequent metal plating, comprising:

(a) a cyanate ester resin composite having a surface and comprising a cyanate ester resin and fiber; and (b) a layer consisting essentially of cyanate ester resin applied to said surface, said surface thereafter etched once said layer is applied to said surface, said etching comprising treating said layer with an etching solution comprising a compound selected from the group consisting of a quaternary ammonium hydroxide and a primary amine, thereby promoting adhesion directly between said cyanate ester resin composite and a subsequently-plated metal.

11. The cyanate ester resin composite of claim 10 wherein said cyanate ester resin composite comprises a cyanate ester resin and fiber having a composition selected from the group consisting of graphite, fiberglass, and aromatic polyamide.

12. The cyanate ester resin composite of claim 10 wherein said layer is applied to said surface of said cyanate ester resin composite by first placing said layer on said surface then simultaneously curing said layer and said cyanate ester resin composite, thereby securing said layer to said surface.

13. The cyanate ester resin composite of claim 12 wherein said surface of said cyanate ester resin composite comprises surface cyanate ester resin, said surface cyanate ester resin and said layer together having a thickness of at least about 3.5 µm once cured.

14. The cyanate ester resin composite of claim 13 wherein said layer is applied to said surface at a thickness of at least about 0.001 inch (25 µm).

15. The cyanate ester resin composite of claim 14 wherein said layer, following etching of said surface, has a thickness ranging from about 1 to 2 µm.

16. The cyanate ester resin composite of claim 10 wherein said layer is treated sequentially with at least two etching solutions comprising a primary amine.

17. The cyanate ester resin composite of claim 10 wherein said adhesion between said etched cyanate ester resin composite and said subsequently-plated metal ranges from about 4 to 5 as measured by ASTM method D3359B using a pressure-sensitive tape having a 40 to 150-oz/mch-width adhesion.

18. The cyanate ester resin composite of claim 10 wherein said subsequently-plated metal is selected from the group consisting of nickel and copper.

19. A method for preparing the surface of a cyanate ester resin composite for a subsequent plating with metal, comprising:

(a) providing a cyanate ester resin composite, said cyanate ester resin composite having a surface and comprising a cyanate ester resin and fiber;

(b) applying a layer consisting essentially of a cyanate ester resin to said surface of said cyanate ester resin composite, thereby producing a layered composite surface; and (c) etching said layered composite surface to promote adhesion directly between said cyanate ester resin composite and said subsequently-plated metal, said etching comprising treating said composite with an etching solution comprising a compound selected from the group consisting of a quaternary ammonium hydroxide and a primary amine.

20. The method of claim 19 wherein said layer is treated sequentially with at least two etching solutions comprising a primary amine.

* * * * *